United States Patent [19]
Jones et al.

[11] Patent Number: 4,905,002
[45] Date of Patent: Feb. 27, 1990

[54] DELTA MODULATION ENCODER/DECODER METHOD AND SYSTEM

[75] Inventors: Paul W. Jones, Churchville; Majid Rabbani, Rochester, both of N.Y.

[73] Assignee: Eastman Kodak Company, Rochester, N.Y.

[21] Appl. No.: 166,072

[22] Filed: Mar. 9, 1988

[51] Int. Cl.$^4$ ............................................. H03M 7/32
[52] U.S. Cl. ...................................... 341/77; 341/76; 371/54
[58] Field of Search ....................... 341/50, 59, 63, 76, 341/87, 77, 143; 358/135, 260, 261.1; 371/53, 54; 375/27, 28; 370/27

[56] References Cited
U.S. PATENT DOCUMENTS

| | | | |
|---|---|---|---|
| 4,002,981 | 1/1977 | Eggermont | 341/77 |
| 4,005,411 | 1/1977 | Morrin | 341/63 |
| 4,136,363 | 1/1979 | Saran | 358/135 |
| 4,201,958 | 4/1980 | Ahamed | 341/77 X |
| 4,656,633 | 4/1987 | Todd | 371/54 |

Primary Examiner—William M. Shoop Jr.
Assistant Examiner—Brian K. Young
Attorney, Agent, or Firm—Edward Dugas

[57] ABSTRACT

A method and a system for compressing a delta modulation coded bit string by logically adding together, in mod 2 fashion, adjacent string bits to generate a transformed bit string which is then runlength encoded to provide a compressed bit string. A second embodiment of the invention uses an alternate bit complementation transform which is based on complementing every alterate bit of the bit string to provide a transformed bit string which is then runlength encoded to provide a compressed bit string. Decoding is accomplished by inversing the encoding methods.

10 Claims, 4 Drawing Sheets

DELTA MODULATION ENCODER/DECODER METHOD AND SYSTEM

BACKGROUND OF THE INVENTION

The present invention is directed to the compression of delta modulation coded sequences that represent successive scan lines of image data.

A delta modulation system is one in which each sample of an image is compared to a predicted value and the difference is encoded as one of only two binary levels. The Predicted value is formed using a linear combination of previously reconstructed signal values. The binary level is indicative of whether the difference is being approximated by a positive or a negative step. In other words, a delta encoder generates a binary one in the case of a negative-difference and a binary zero in the case of a positive-difference, or vice versa. In regions corresponding to a uniform gray level, scanned image data processed by a delta modulator will characteristically produce an alternating output of "101010 . . . " bits. The aforementioned bit sequence is valid for a 1-D predictor. For higher order predictors, e.g., 2-D predictors, the output bit string for a large uniform area will also be "10101 . . . ". Since the output bit strings of alternating ones and zeros occur frequently in delta modulated image data sequences, it is highly desirable to develop an efficient coding scheme which will compress these alternating strings.

It has been recognized that alternating strings of binary bits can be compressed using runlength encoding.

One patent of interest for its teaching of such a compression method is U.S. Pat. No. 4,005,411 entitled "Compression of Gray Scale Imagery to Less Than One Bit Per Picture Element" by T. H. Morrin, II. In the background section of that patent it is recognized that a constant scan input, when delta encoded, will output a string of "10101 . . . " bits. In the apparatus disclosed in that patent a predictor operates upon scan lines of data to predict the next bit. If the predictor is correct, a zero bit is recorded. If the predictor is not correct, a one is recorded. Generally, a long string of zeros will thus be generated. The long string can then be runlength encoded. The disclosed apparatus utilizes a logical mod 2 combining of the predictor's output signal with the delta encoded signal to derive an error image signal. The thus derived error image signal is runlength encoded.

In the aforementioned apparatus a decoding error will propagate through the reconstructed image due to the fact that the predictor makes subsequent use of previously encoded data.

Another patent of interest for its teaching is U.S. Pat. No. 4,136,363 entitled "Truncated Run Length Encoding" by A. Saran. The apparatus of that patent uses a current scan line and the previous scan line to generate a difference signal. The difference signal is formed as a mod 2 difference. In a manner similar to the preceding Morrin, II patent '411, errors can propagate through an image because previous lines of data are used to form a prediction for the current line. The inventor Morrin, II recognized this problem and provided as a solution that for every n lines of transmitted coded data that at least one line of uncoded data be transmitted so as to break the sequence of error propagation.

A delta encoder/decoder signal compression method and system which eliminates the propagation of error data while providing the benefits of signal compression utilizing runlength encoding is therefore desirable.

SUMMARY OF THE INVENTION

The method and system of the present invention operates through a reversible transformation which is applied to the output bit string of a delta modulation system to enable portions of the output bit stream to be runlength encoded. The transformation converts strings of alternating polarity bits, i.e., "10101 . . . ", to strings of like polarity bits, i.e., "00000 . . . " or "11111 . . . ". The transformation is done on a line-by-line basis so that an error will propagate only across a single line.

In one method embodiment of the present invention based on an alternate bit complementation transform, the strings of alternating polarity bits have every second bit changed so as to convert the string to either strings of zero bits or strings of one bits which strings are then runlength encoded. Although acceptable, this approach has a limitation in that a delta modulation system output bit string of like polarity bits is converted, by the alternate bit complementation method, to an alternating polarity bit string, that is, a bit stream of "1010 . . . " bits. This, in turn, shortens the compression efficiency by shortening the total number of runlengths that are achievable for an average data image.

In a second method embodiment of the present invention adjacent bits are logically added together, in mod 2 fashion, to generate the transformed bit string. The first bit in the string is sent unchanged. Then the first and second bits are added mod 2 and the result sent as the next bit. The second and third bits are added mod 2 and the result sent as the next bit, etc. This results in an increase in the total number of runlengths of like bits that are available for runlength encoding.

Also disclosed is an apparatus for accomplishing the methods described above in a delta modulation encoder/decoder system.

From the foregoing, it can be seen that it is an object of the present invention to provide a method and a system for compressing digital data utilizing encoding and decoding techniques that permit runlength encoding and decoding.

It is a further object of the present invention to provide a system which transforms delta encoded signals for runlength encoding.

The aforementioned and other objects of the present invention will become more apparent and better understood when taken in conjunction with the following description and drawings throughout which like characters indicate like parts and which drawings form a part of this application.

A BRIEF DESCRIPTION OF THE DRAWINGS

DESCRIPTION OF THE PREFERRED EMBODIMENT

Figure 1:
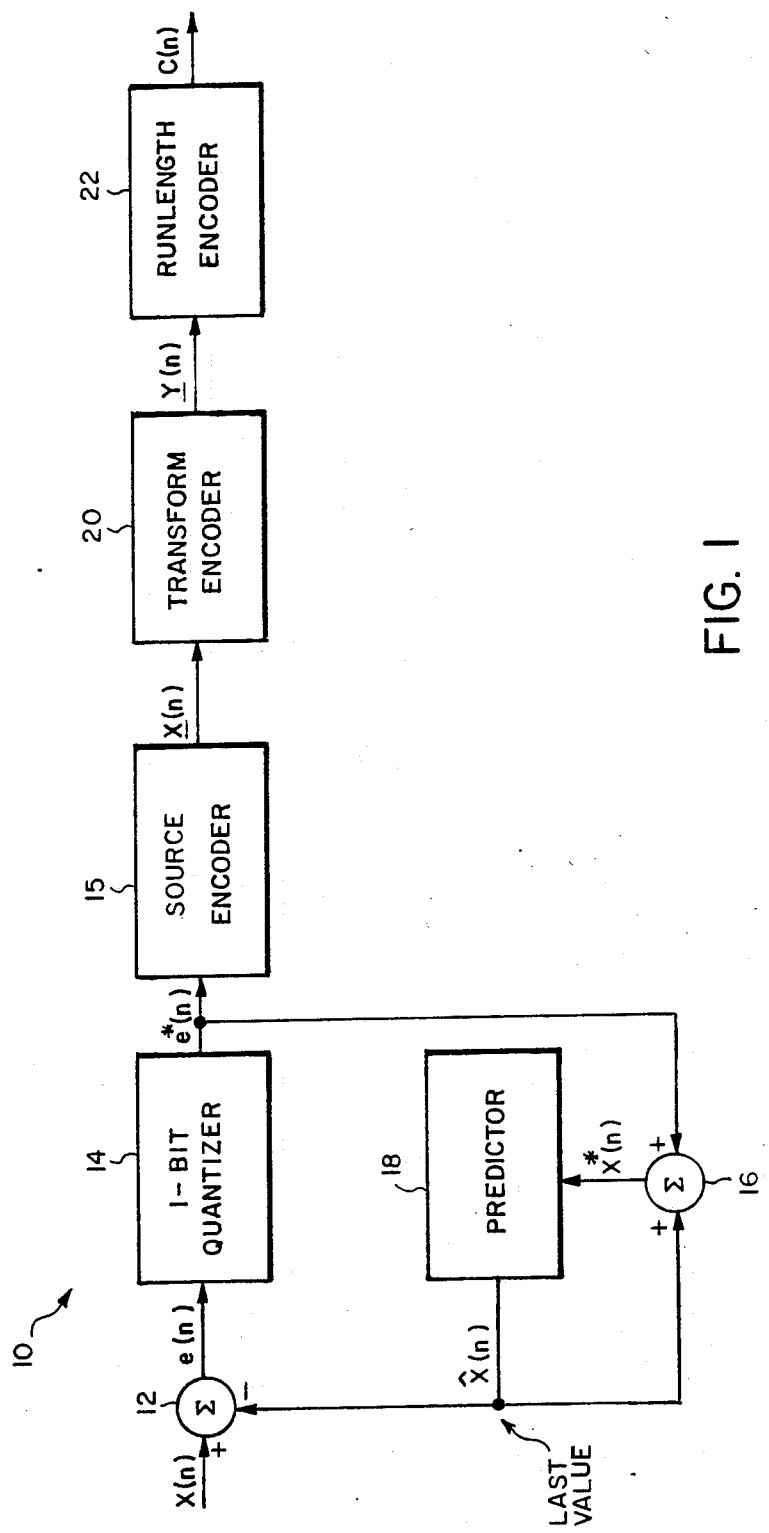
FIG. 1 is a block diagram of a delta modulation encoder incorporating the transform based encoder of the present invention.

Referring now to FIG. 1, wherein is disclosed the preferred embodiment of the encoder of the present invention incorporated in a delta modulation encoder 10 as a transform encoder 20 and a runlength encoder 22. The delta modulation encoder 10 may be of the adaptive or of the nonadaptive type. A delta modulator is a differential pulse code modulator scheme which uses a 1-bit quantizer. A differential pulse code modulator predicts the value of a given input value based upon previous input values. Instead of transmitting the actual value, the difference between the actual value and the predicted value is quantized, encoded, and transmitted. Generally speaking, there are three major components in a delta modulation system. They are a predictor, a quantizer, and an encoder. In the delta modulation system the difference signal can be quantized to one of two possible levels. Although not specifically shown for purposes of simplicity, the principle behind an adaptive delta modulator is to vary the quantization levels based on the characteristics of the received signal.

In the present embodiment, the delta modulation encoder 10 is generally used to operate upon either an image signal comprised of pixel values or upon a speech signal, which, in either case, is sampled to form an input signal X(n). The input signal may receive various types of processing other than sampling prior to its being applied to the input of a summer 12. The summer 12 sums in a subtracting, or difference mode, the last value signal X(n) received from a predictor 18 to provide a difference or error signal e(n). The difference signal e(n) is directed to the input of a 1-bit quantizer 14. The output of the quantizer 14 is a quantized difference signal e*(n) which has associated with it a value of 0 or 1. The 0 or 1 value indicates whether a positive or a negative step should be added to the predicted value based on the value of the input signal. For example, for a 1-D predictor where the predictor outputs the previous pixel value, the output bit string from the quantizer 14, for signals corresponding to a flat region received at the input to the summer 12, will be a string of "10101 . . . ". In a like manner, for a higher order predictor, i.e., a 2-D predictor, the output bit string from the quantizer 14 will, for a large uniform area, also be a string of "10101 . . .".

The predictor 18 receives at its input the sum of the last value signal X(n) provided at its output, and the quantized difference signal e*(n) from the 1-bit quantizer 14. The summing is performed in a summing circuit 16. For many types of images, large areas of uniform density will occur frequently. Examples include text and document images where the background areas are large in uniform density. The quantized difference signal e*(n), from the quantizer 14, is directed to the input of a source encoder 15. The source encoder 15 maps the signal e*(n) into a bit string $\underline{X}(n)$ of zero and one bits dependent on the polarity of the quantized difference signal e*(n). The signal $\underline{X}(n)$ is directed to the input of a transform encoder 20. The transform encoder 20 converts strings of alternating polarity bits, i.e., "10101 . . . ", to strings of like polarity bits, i.e., "00000 . . ." or "11111 . . . ". These strings of like polarity bits, denoted $\underline{Y}(n)$, can then be processed in a runlength encoder 22. The output bit string, denoted C(n), from the runlength encoder 22 is thus compressed to a smaller number of bits than heretofore possible.

Two types of transform apparatus for accomplishing bit string transformation will be disclosed. The first is based on a mod 2 sum of adjacent bits scheme, and the second is based on an alternate bit complementation scheme. The following chart illustrates the bit patterns resulting from these two types of transformations:

| TRANSFORMATIONS | |
| --- | --- |
| Original Bit Stream: | 1 0 1 0 1 0 1 0 1 1 1 1 0 0 0 0 |
| Mod 2 Sum of Bits: | 1 1 1 1 1 1 1 1 1 0 0 0 1 0 0 0 |
| Alt. Bit Complement: | 1 1 1 1 1 1 1 1 1 0 1 0 0 1 0 1 |

Figure 3:
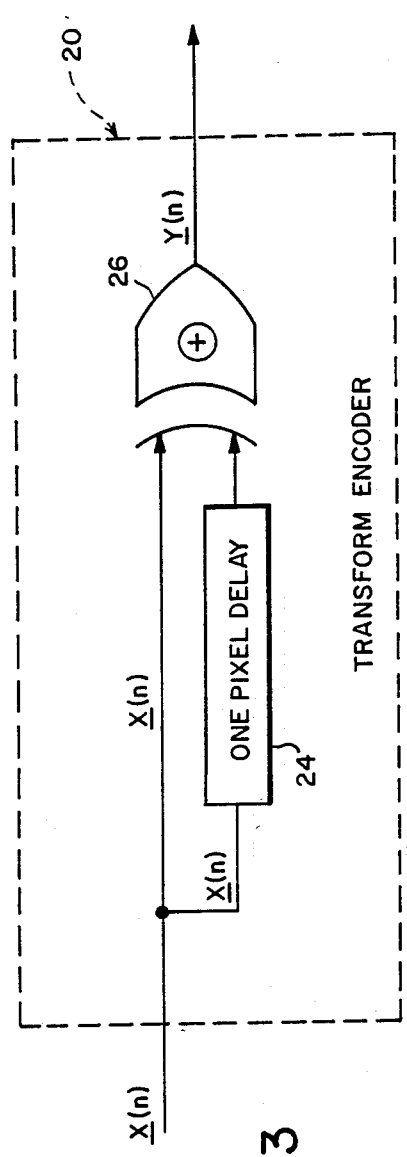
FIG. 3 is a logic block diagram of a transform based encoder which may be used in the embodiment of FIG. 1.

The transform encoder 20, for performing the mod 2 sum transform is disclosed in FIG. 3. The transform encoder 20 is comprised of a one pixel delay circuit 24 having an input connected to receive the mapped difference signal $\underline{X}(n)$ from the source encoder 15 and an exclusive OR gate 26 having one input connected to the output of the source encoder 15 and the other input connected to the output of the one pixel delay circuit 24. The resultant output bit stream, denoted $\underline{Y}(n)$, is shown in the TRANSFORMATIONS table adjacent the heading "Mod 2 Sum of Bits".

The following illustrates the logical signal combinations for the encoding and decoding according to Scheme 1:

Scheme 1: Mod 2 Sum of Adjacent Bits

For encoding $$\text{Let } X = [X_0 \, X_1 \, X_2 \, X_3 \ldots X_N]$$

$$\text{Then } Y = [X_0 \, X_1 \, X_2 \, X_3 \ldots X_N]$$
$$\oplus$$
$$[0 \, X_0 \, X_1 \, X_2 \ldots X_{N-1}]$$

Where
  $\underline{X}$ is the input vector (bit string)
  $\underline{Y}$ is the output vector (bit string) and
  $\oplus$ is a mod 2 sum or an exclusive OR operation. For decoding $$\text{Let } X: \quad X_0 = Y_0 \oplus 0$$
$$X_1 = Y_1 \oplus X_0$$
$$X_2 = Y_2 \oplus X_1$$
$$X_3 = Y_3 \oplus X_2$$
$$\vdots$$
$$X_N = Y_N \oplus X_{N-1}$$

Figure 5:
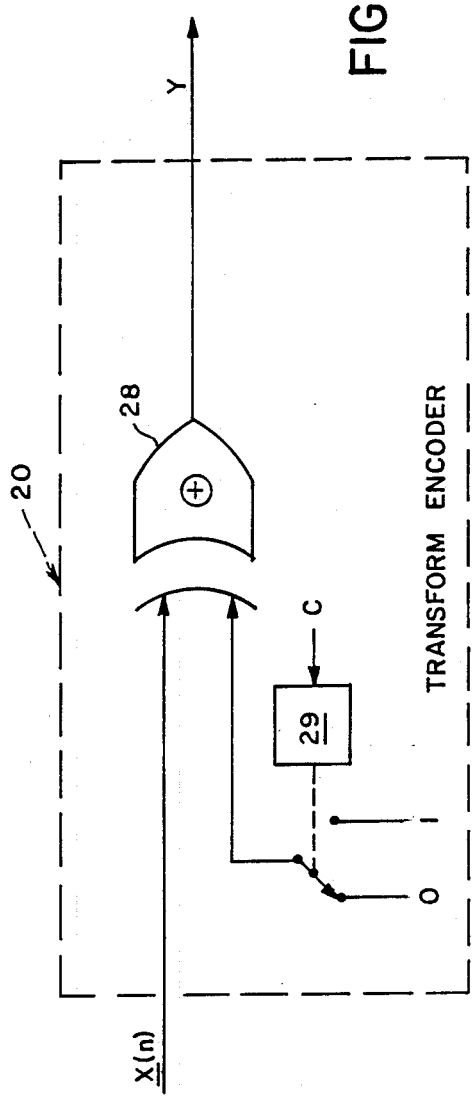
FIG. 5 is a diagram illustrating the interconnection of an exclusive OR gate as a transform based encoder.

A second type of transform encoder 20 is shown in FIG. 5 comprised of an exclusive OR gate 28 having one input connected to the output of the source encoder 15 and the other input connected to toggle between a binary bit value of 0 and a binary bit value of 1 under control of a toggling circuit 29 having an input connected to receive a system clock signal C. The system clock C is a signal that toggles at the pixel rate of the input signal X(n) and which is generated by the system in which the encoder and decoder of the present invention are used. The output bit pattern for the alternate bit complementation transformation is shown in the preceding TRANSFORMATIONS table. The logic signal relationship for accomplishing the encoding and decoding of the bit pattern according to Scheme 2 is shown by the following:

Scheme 2: Bit Complementation

For encoding

Let $X = [X_0\ X_1\ X_2\ X_3\ \ldots\ X_N]$

Then $Y = [\overline{X_0}\ X_1\ \overline{X_2}\ X_3\ \ldots\ X_N]$ or $$Y = [X_0\ X_1\ X_2\ X_3\ \ldots\ X_N]$$
$$\oplus$$
$$[0\ 1\ 0\ 1\ \ldots\ 0]$$

Figure 2:
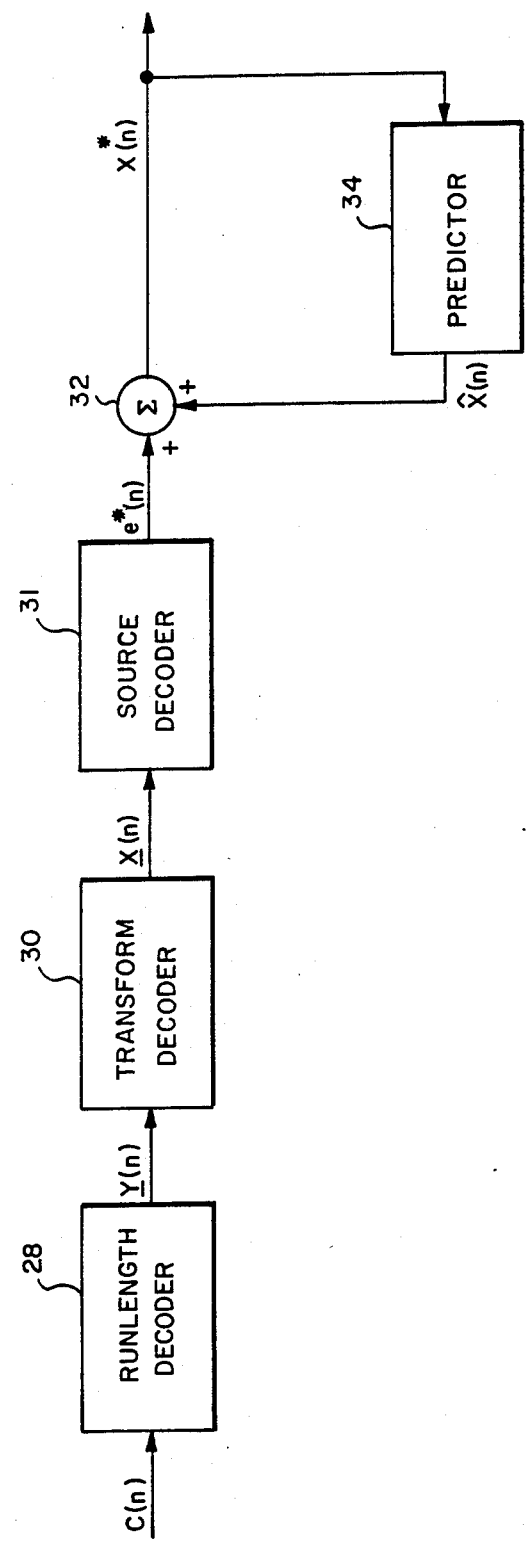
FIG. 2 is a block diagram of a delta modulation decoder incorporating a transform based decoder according to the present invention.

Where
  $\underline{X}$ is the input vector (bit string)
  $\underline{Y}$ is the output vector (bit string) and
  $\oplus$ is a mod 2 sum or exclusive OR For decoding Let $\underline{X}$: $\underline{X} = \underline{Y} \oplus [0\ 1\ 0\ 1\ \ldots\ ]$ Referring now to FIG. 2 wherein is shown a delta modulation receiver of the type that can be utilized with the encoder of FIG. 1.

The signal C(n) is received at the input of a runlength decoder 28. The runlength decoder 28 functions to complement the encoding process that took place within the runlength encoder 22 to provide the decoder signal $\underline{Y}$(n). The decoded signal $\underline{Y}$(n) is applied to the input of a transform decoder 30. The transform decoder 30 is implemented to provide an inverse function of the transform encoder function performed by the transform encoder 20 in the encoder of FIG. 1. The transform decoder 30 provides the reconstructed signal $\underline{X}$(n) to a source decoder 31. The source decoder 31 outputs the signal e*(n) by functioning to perform the inverse process used in the source encoder 15. The signal e*(n) is applied to the positive input of a summer circuit 32. The summer 32 also receives as a positive input the output signal X(n) from a predictor circuit 34. The predictor circuit 34 receives as its input the output decoded signal X*(n) from the summer 32.

Figure 4:
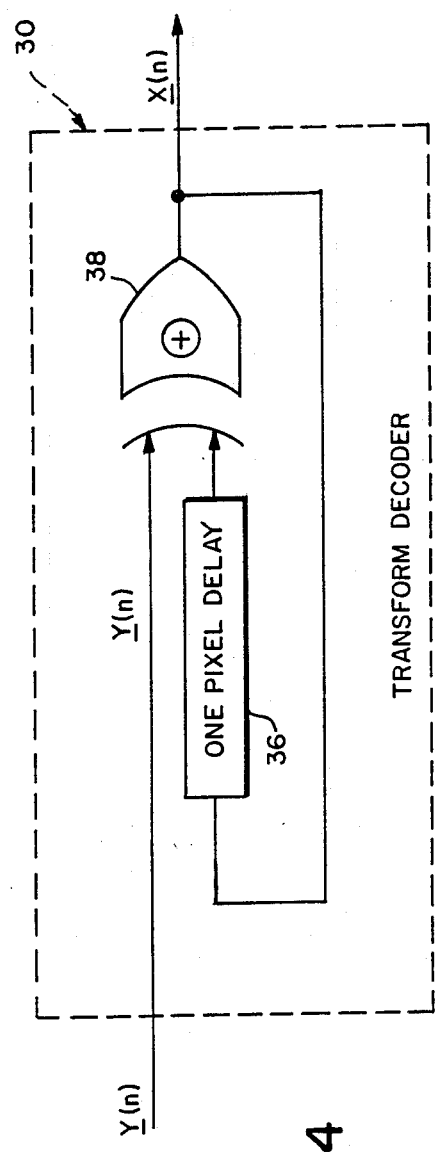
FIG. 4 is a logic diagram of a transform based decoder which may be used in the decoder embodiment of FIG. 2.

One preferred implementation of the transform decoder 30 is shown in FIG. 4 for use when a mod 2 sum of adjacent bits encoder of the type shown in FIG. 3 is incorporated in the encoder. The decoder 30 is comprised of an exclusive OR gate 38 having one input connected to the output of the runlength decoder 28 and the other input connected to receive the output of a one pixel delay circuit 36. The input to the one pixel delay circuit 36 is connected to the output of the exclusive OR gate 38. The output of the exclusive-OR gate 38 is the signal $\underline{X}$(n) which is also directed as the positive input to the source decoder 31.

Figure 6:
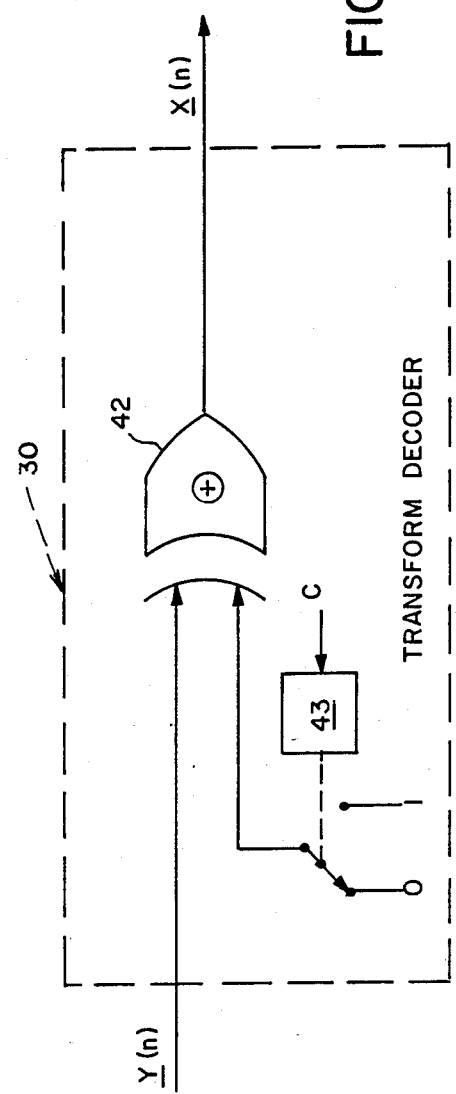
FIG. 6 is a schematic diagram of the interconnection of an exclusive OR gate as a transform based decoder.

A second alternate embodiment of the transform decoder 30 is illustrated in FIG. 6 comprised of an exclusive OR gate 42 receiving at one of its inputs the signal $\underline{Y}$(n) from the runlength decoder 28. The exclusive-OR gate 42 receives on its other input a 0 bit signal or a 1 bit signal, the selection of which is under the control of a toggling switch 43 which receives as its control input the system clock signal C.

While there has been shown what is considered to be the preferred embodiments of the invention, it will be manifest that many changes and modifications may be made therein without departing from the essential spirit of the invention. It is intended, therefore, in the annexed claims, to cover all such changes and modifications as may fall within the true spirit of the invention.

We claim:

1. An encoder for use in a delta modulation encoder of the type which provides a binary level signal indicative of the difference between an input signal and the predicted value of the input signal being approximated by a positive or a negative step comprising:
   a delay means for receiving said provided binary level signal and for providing an output delayed by one time period later;
   an exclusive-OR means for receiving said binary level signal and the delayed signal from said delay means for providing a mod 2 transformed output signal; and
   a runlength encoder means for runlength encoding the output signal from said exclusive-OR means.

2. An encoder for use in a delta modulation encoder of the type which provides a binary level signal indicative of the difference between an input signal and a predicted value of the input signal being approximated by a positive or a negative step comprising:
   a source of individual signals of a first and of a second binary value;
   a switch means responsive to a clock signal for alternately connecting said first and said second binary value signals to a switch output;
   an exclusive-OR means having an input connected to receive said provided binary signal from said delta modulation encoder and an input connected to receive the binary signal provided at the output of said switch means for providing a transformed output signal; and
   a runlength encoder means for runlength encoding the output signal from said exclusive-OR means.

3. A decoder for use in a delta modulation decoder of the type which decodes a runlength encoded mod 2 transformed delta modulated signal comprising:
   a runlength decoder means for receiving the runlength encoded mod 2 transformed delta modulated signal and for providing an output signal corresponding to a mod 2 transformed delta modulated signal; and
   a transform decoder coupled to the output of said runlength decoder for decoding the mod 2 transformed delta modulated signal to provide a delta modulated signal to said delta modulation decoder for further decoding.

4. A decoder for use in a delta modulation decoder of the type which decodes a runlength alternate bit transformed delta modulated signal comprising;
   a runlength decoder means for receiving the runlength alternate bit transformed delta modulated signal and for providing an output signal corresponding to an alternate bit transformed delta modulated signal; and
   a transform decoder coupled to the output of said runlength decoder for decoding the alternate bit transformed delta modulated signal to provide a delta modulated signal to said delta modulation decoder for further decoding.

5. The decoder according to claim 3 wherein said transform decoder is comprised of:

an exclusive-OR means having two inputs, one connected to receiving the mod 2 transformed delta modulated signal and for providing at its output the delta modulated signal to said delta modulation decoder; and a delay means for receiving the provided delta modulated signal and for providing an output delayed by one time period later to the other input of said exclusive-OR means.

6. The decoder according to claim 4 wherein said transform decoder is comprised of:

a source of individual signals of a first and of a second binary value;

a switch means responsive to a clock signal for alternately connecting said first and said second binary value signals to a switch output;

an exclusive-OR means having one input connected to receive the alternate bit transformed delta modulated signal, and a second input for receiving the output from said switch means for providing at its output a delta modulated signal.

7. A method of compressing a delta modulated coded signal comprising the steps of:

(a) transforming said delta modulated coded signal by mod 2 summing the adjacent bits forming said delta modulated coded signal; and (b) runlength encoding the transformed delta modulated coded signal to compress said signal.

8. A method of compressing a delta modulated coded signal comprising the steps of:

(a) transforming said delta modulated coded signal by complementing each alternate bit forming said delta modulated coded signal; and (b) runlength encoding the transformed delta modulated coded signal to compress said signal.

9. A method of decompressing a runlength encoded and mod 2 sum of adjacent bit transformed delta modulated coded signal comprising the steps of:

(a) runlength decoding the transformed delta modulated coded signal to decompress said signal; and (b) inverse transforming said transformed delta modulated coded signal to provide said delta modulated coded signal.

10. A method of decompressing a runlength encoded and transformed by complementing each alternate bit delta modulated coded signal comprising the steps of:

(a) runlength decoding the transformed delta modulated coded signal to decompress said signal; and (b) inverse transforming said transformed delta modulated coded signal to provide said delta modulated coded signal.

* * * * *